United States Patent [19]

Park

[11] Patent Number: 5,368,682
[45] Date of Patent: Nov. 29, 1994

[54] METHOD FOR FORMING CONTACT HOLE IN HIGHLY INTEGRATED SEMICONDUCTOR DEVICE

[75] Inventor: Sung W. Park, Kyoungki, Rep. of Korea

[73] Assignee: Hyundai Electronics Industries Co., Ltd., Kyoungki, Rep. of Korea

[21] Appl. No.: 202,556

[22] Filed: Feb. 28, 1994

[30] Foreign Application Priority Data

Mar. 2, 1993 [KR] Rep. of Korea .................. 93-2955

[51] Int. Cl.$^5$ ............................................. B23P 15/00
[52] U.S. Cl. .................................. 156/644; 156/643; 437/981
[58] Field of Search ............... 156/644, 643; 437/981, 437/947, 982

[56] References Cited

U.S. PATENT DOCUMENTS

| | | | |
|---|---|---|---|
| 4,654,113 | 3/1987 | Tuchiya | 156/643 |
| 5,063,176 | 11/1991 | Lee | 437/982 |
| 5,166,088 | 11/1992 | Ueda | 437/47 |
| 5,174,858 | 12/1992 | Yamamoto | 156/643 |
| 5,269,880 | 12/1993 | Jolly | 156/643 |
| 5,275,972 | 1/1994 | Ogawa | 156/644 |
| 5,279,989 | 1/1994 | Kim | 437/195 |

FOREIGN PATENT DOCUMENTS 0084024  4/1986  Japan .................... 437/981

*Primary Examiner*—R. Bruce Breneman
*Assistant Examiner*—J. Y. Chang
*Attorney, Agent, or Firm*—Popham, Haik, Schnobrich & Kaufman, Ltd.

[57] ABSTRACT

A method for forming a contact hole in a semiconductor device, capable of reducing the dimension of the contact hole below the limit set by semiconductor fabrication equipment. The method includes the steps of preparing a semiconductor substrate formed at an upper surface thereof with a first wiring pattern, forming an interlayer insulating film over the entire surface of the semiconductor substrate, forming an selective etch film over the interlayer insulating film, forming an oxide layer over the selective etch film, the oxide layer having a very high etch selectivity to the selective etch film, forming a pseudo-contact hole in the oxide layer, the selective etch film being partially exposed through the pseudo-contact hole, deforming side walls of the pseudo-contact hole to have a semicircular shape such that each of the side walls has a protruded central portion, burring an selective etch material in an lower edge portion of the contact hole such that the side walls of the pseudo-contact hole have a linear shape, and removing the oxide layer and anisotropically etching the resulting structure so as to form a miniature contact hole having a bottom surface comprised of the wiring pattern and side walls comprised of both the interlayer insulating film and the selective etch film.

9 Claims, 3 Drawing Sheets

METHOD FOR FORMING CONTACT HOLE IN HIGHLY INTEGRATED SEMICONDUCTOR DEVICE

BACKGROUND OF THE INVENTION

1. Field of the Invention

The present invention relates to a method for fabricating a metal plug for electrically connecting metal wiring layers, respectively over and beneath an interlayer insulating film in a highly integrated semiconductor device, and more particularly to a method for forming a contact hole in such a semiconductor device, capable of improving an integration degree.

2. Description of the Prior Art

Generally, highly integrated semiconductor devices such as direct random access memories (DRAMs), static random access memories (SRAMs) and application specific integrated circuits (ASICs) have a structure including a plurality of wiring layers, a plurality of interlayer insulating films, each interposed between vertically adjacent wiring layers, and a contact formed in each interlayer insulating film and adapted to electrically connect the wiring layers associated with the interlayer insulating film. As the dimension of the contact is larger, the highly integrated semiconductor device has a higher integration degree. The dimension of the contact is determined by the dimension of the contact hole. However, it is impossible to reduce the dimension of the contact hole below a certain level due to limitation on semiconductor fabrication equipment such as light exposure devices. As a result, the conventional highly integrated semiconductor devices have a limitation on the integration degree.

SUMMARY OF THE INVENTION

Therefore, an object of the invention is to provide a method for forming a contact hole in a highly integrated semiconductor device, capable of minimizing the dimension of a contact hole formed in an interlayer insulating film, thereby achieving an improvement in integration degree.

In accordance with the present invention, this object can be accomplished by providing a method for forming a contact hole in a semiconductor device, comprising the steps of: preparing a semiconductor substrate formed at an upper surface thereof with a first wiring pattern; forming an interlayer insulating film over the entire surface of said semiconductor substrate; forming an selective etch film over said interlayer insulating film; forming an assistant selective etch layer over said selective etch film, said assistant selective etch layer having a very high etch selectivity to the selective etch film; forming a pseudo-contact hole in the assistant selective etch layer, said selective etch film being partially exposed through said pseudo-contact hole; deforming side walls of the pseudo-contact hole to have a semicircular shape such that each of said side walls has a protruded central portion; burring an selective etch material in an lower edge portion of the contact hole such that the side walls of the pseudo-contact hole have a linear shape; and removing the assistant selective etch layer and anisotropically etching the resulting structure so as to form a miniature contact hole having a bottom surface comprised of said wiring pattern and side walls comprised of both the interlayer insulating film and the selective etch film.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
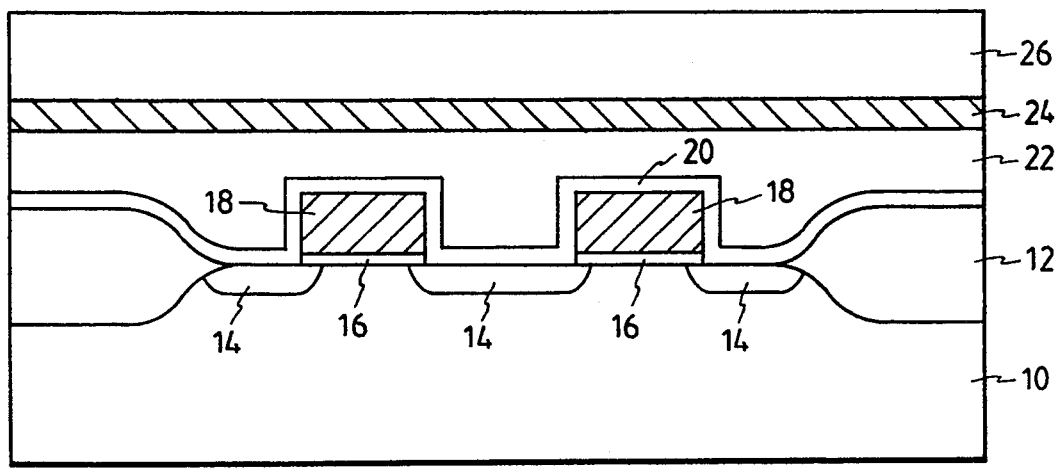
FIGS. 1 to 6 are sectional views respectively illustrating a method for forming a contact hole in a highly integrated semiconductor device in accordance with the present invention.

Referring to FIGS. 1 to 6, there is illustrated a method for forming a contact hole in a highly integrated semiconductor device in accordance with the present invention.

In accordance with this method, a semiconductor substrate 10 is prepared which includes a plurality of impurity-diffused regions 16 respectively formed over device regions isolated from one another by a device-isolating insulating film 12, a plurality of gate oxide film patterns 16 each disposed over a channel region defined between adjacent impurity-diffused regions, and a plurality of gate electrode patterns 18 each formed over each gate oxide film pattern 16. Over the entire exposed surface of the semiconductor substrate 10 including the gate electrode patterns 18, a first oxide film 20, an interlayer insulating film 22, a first highly-selective etch film 24 and a second oxide layer 26 are sequentially deposited in this order. The interlayer insulating film 22 is comprised of an oxide film. The first highly-selective etch film 24 is comprised of a silicon nitride film or a polysilicon film, having a very low etch selectivity to the second oxide layer 26. The second oxide layer 26 is made of an oxide containing an impurity such as phosphorous or a mixture of phosphorous and boron.

Figure 2:
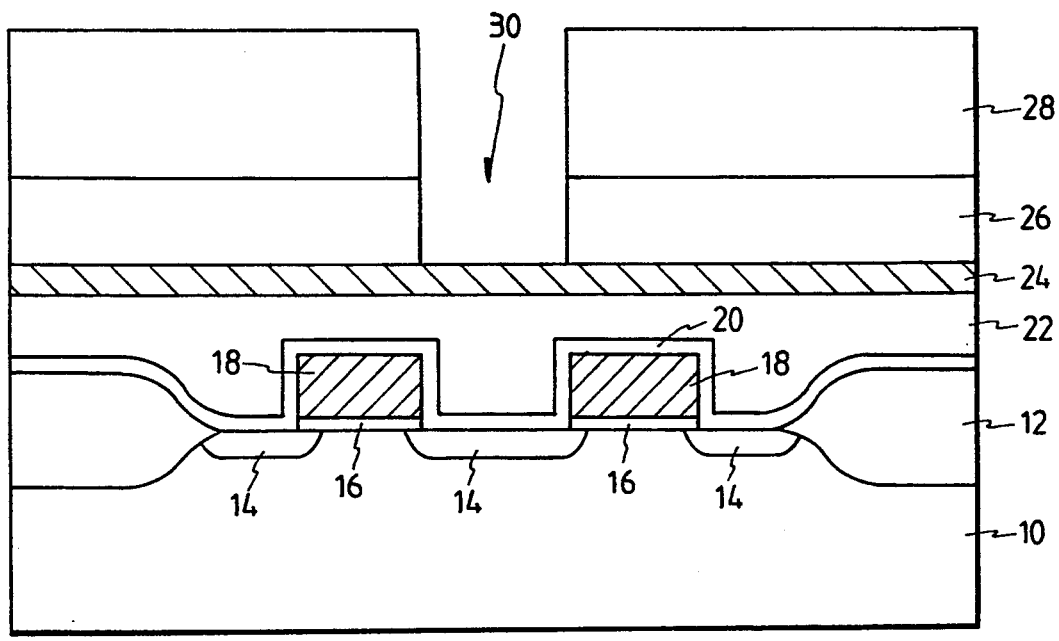

Spaced mask patterns 28 are then formed over the oxide layer 26, as shown in FIG. 2. Thereafter, a groove 30 is formed in a portion of the second oxide layer 26 exposed between adjacent mask patterns 28. The formation of the groove 30 is achieved by etching the portion of the second oxide layer 26 exposed between the adjacent mask patterns 28. The groove 30 has a bottom surface provided by the first highly-selective etch film 24. After the formation of the groove 30, the mask patterns 28 are removed.

Figure 3:
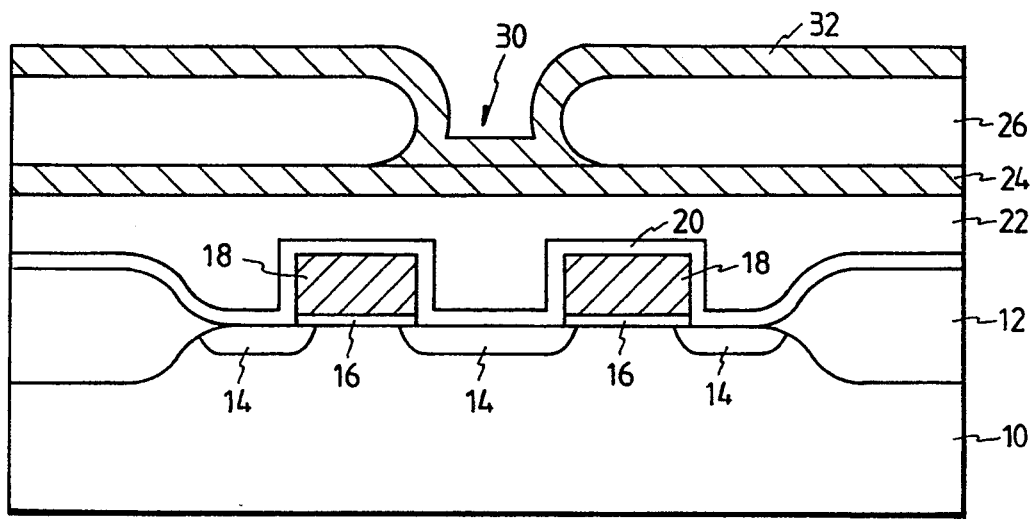
Figure 4:
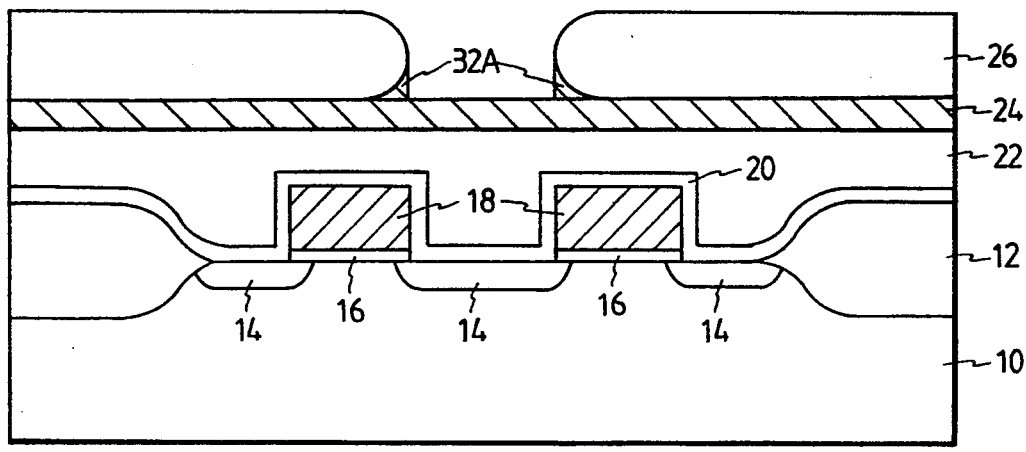

The resulting structure is then subjected to a heat treatment in a high temperature rapid heat treatment equipment providing a nitrogen or oxygen atmosphere (namely, the high temperature rapid heat treatment equipment is filled with nitrogen or oxygen gas). By this heat treatment, the groove 30 has semicircular side walls, as shown in FIG. 3. Over the entire exposed surface of the resulting structure, a second highly-selective etch film 32 is deposited such that it covers the semicircular side walls, bottom surface of the groove 30 and the surface of the second oxide layer 26. The second highly-selective etch film 32 is comprised of a silicon nitride film or a polysilicon film, similar to the first highly-selective etch film 24.

Subsequently, the second highly-selective etch film 32 is selectively etched such that it remains at the lower portions of the side walls of the groove 30 as a remainder 32A. The etching of the second highly-selective etch film 32 is achieved by using an anisotropic etch process.

Figure 5:
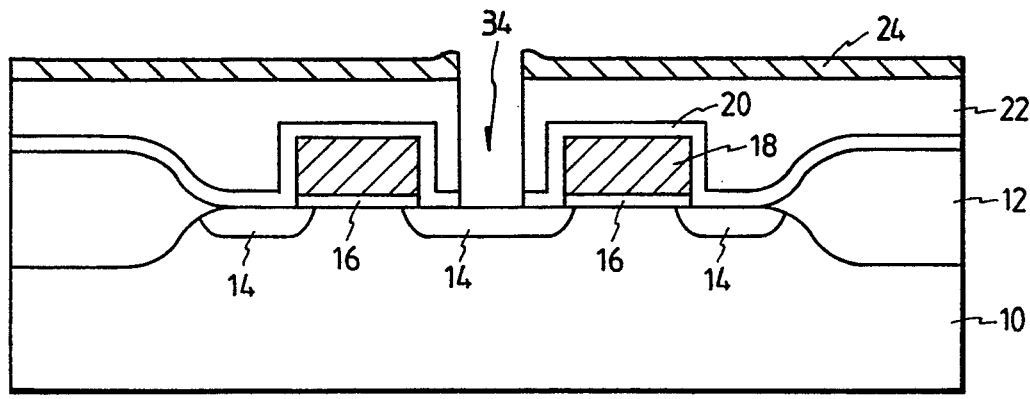

The second oxide layer 26 is then removed by use of a blanket oxide etch process in which an anisotropic etch is carried out, as shown in FIG. 5. During the blanket oxide etching, the portion of the first highly-selective etch film 24 exposed through the groove 30 of the second oxide layer 26, and the portions of the interlayer insulating film 22 and the first oxide film 20 disposed beneath the exposed portion of the first highly-selective etch film 24 are also etched, thereby forming a contact hole 34. The contact hole 34 has a dimension smaller than that of the groove 30 shown in FIG. 2. The dimension of the contact hole 34 can be adjusted by a heat treatment temperature used in the heat treatment process or the thickness of the second oxide layer 26. For example, where the thickness of the second oxide layer 26 or the heat treatment temperature is increased, the flowing the second oxide layer 26 is increased, thereby causing the dimension of the contact hole 34 to be reduced.

Figure 6:
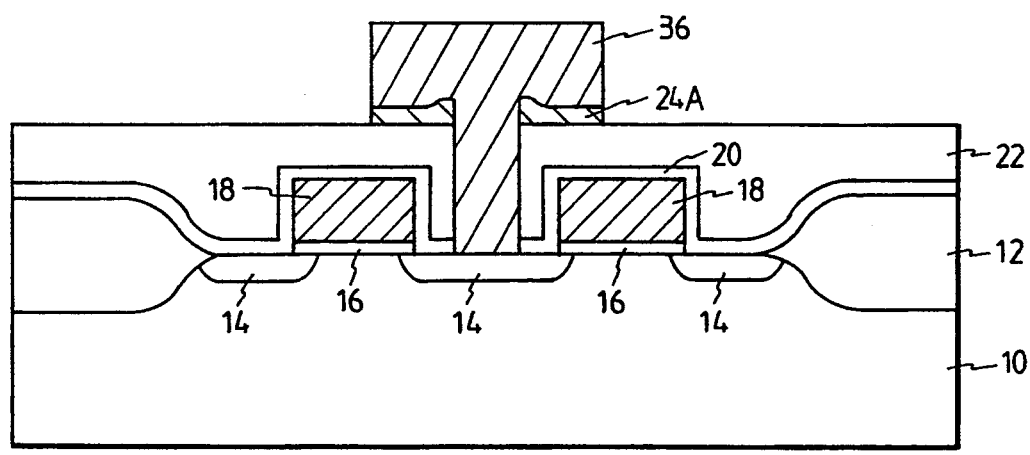

Thereafter, a conduction layer is formed over the entire exposed surface of the resulting structure including the contact hole 34. The conduction layer is then selectively etched by use of a mask pattern not shown, thereby forming a wiring line 36, as shown in FIG. 6. Using the wiring line 36 as a mask, the first highly-selective etch film 24 is then selectively etched, thereby forming a first highly-selective etch film pattern 24A interposed between the wiring line 36 and the interlayer insulating film 22.

As apparent from the above description, the present invention provides a method for forming a contact hole in a highly integrated semiconductor device in which the contact hole is formed by etching layers having different etch selectivities. Accordingly, it is possible to reduce the dimension of the contact hole below the limit set by semiconductor fabrication equipment.

What is claimed is:

1. A method for forming a contact hole in a semiconductor device, comprising the steps of:

preparing a semiconductor substrate formed at an upper surface thereof with a first wiring pattern;

forming an interlayer insulating film over the entire surface of said semiconductor substrate;

forming an selective etch film over said interlayer insulating film;

forming an assistant selective etch layer over said selective etch film, said assistant selective etch layer having a very high etch selectivity to the selective etch film;

forming a pseudo-contact hole in the assistant selective etch layer, said selective etch film being partially exposed through said pseudo-contact hole;

deforming side walls of the pseudo-contact hole to have a semicircular shape such that each of said side walls has a protruded central portion;

burring a selective etch material in a lower edge portion of the contact hole such that the side walls of the pseudo-contact hole have a linear shape; and removing the assistant selective etch layer and anisotropically etching the resulting structure so as to form a miniature contact hole, having a bottom surface comprised of said wiring pattern and side walls comprised of both the interlayer insulating film and the selective etch film.

2. A method in accordance with claim 1, wherein said selective etch film is made of silicon nitride and said assistant selective etch layer is made of oxide.

3. A method in accordance with claim 2, wherein said anisotropically etching step is carried out by use of a blanket oxide etch process.

4. A method in accordance with claim 3, wherein said deforming step is carried out by an heat treatment using a high temperature rapid heat treatment equipment in which a nitrogen gas is contained.

5. A method in accordance with claim 4, wherein said high temperature rapid heat treatment equipment contains therein an oxygen gas in place of said nitrogen gas.

6. A method in accordance with claim 5, wherein said oxide forming said assistant selective etch layer contains phosphorous as an impurity.

7. A method in accordance with claim 6, wherein said oxide forming said assistant selective etch layer contains boron as the impurity, in addition to said phosphorous.

8. A method in accordance with claim 2, wherein said selective etch film is made of polysilicon in place of said silicon nitride.

9. A method in accordance with claim 8, wherein said anisotropically etching step is carried out by use of a blanket oxide etch process.

* * * * *